United States Patent

Fleischhammer et al.

[15] 3,660,676

[45] May 2, 1972

[54] CIRCUIT ARRANGEMENT FOR CONVERTING SIGNAL VOLTAGES

[72] Inventors: Werner Fleischhammer, Brunnthal; Friedrich-Karl Kroos, Soecking, both of Germany

[73] Assignee: Siemens Aktiengesellschaft, Berlin and Munich, Germany

[22] Filed: Dec. 15, 1970

[21] Appl. No.: 98,267

[30] Foreign Application Priority Data

Jan. 7, 1970 Germany ....................P 20 00 401.7

[52] U.S. Cl. ..............................307/208, 307/213, 307/218, 307/237, 307/299, 307/317

[51] Int. Cl. ..............................H03k 19/12

[58] Field of Search.................307/207, 208, 213, 214, 215, 307/218, 299 A, 317; 328/92, 93, 94

[56] References Cited

UNITED STATES PATENTS 3,544,808 12/1970 Mukai..............................307/213 X 3,522,444 8/1970 Lourie..................................307/207

3,555,294 1/1971 Treadway.........................307/218 X

*Primary Examiner*—John S. Heyman

*Assistant Examiner*—L. N. Anagnos

*Attorney*—Hill, Sherman, Meroni, Gross & Simpson

[57] ABSTRACT

A logic signal level converter circuit arrangement for connecting the output of a saturated type logic circuit to the input of an unsaturated logic circuit, in which at least one input signal terminal is connected via a respective rectifying junction to a common point that is connected via a resistor to a first supply voltage terminal, the common point being connected via a further rectifying junction to the base of an emitter-follower transistor whose collector is connected to said first supply voltage terminal via a resistor, the emitter of said emitter follower transistor being connected to the base and collector of a multi-emitter transistor which has one emitter connected to a point of fixed potential and a second emitter connected to a second supply voltage terminal of polarity opposite to that of said first supply terminal via a voltage divider consisting of two resistors connected in series and having their junction connected to an output terminal.

5 Claims, 2 Drawing Figures

INVENTORS
Werner Fleischammer
Friedrich-Karl Kroos

BY Hill, Sherman, Meroni, Gross & Simpson ATTYS.

CIRCUIT ARRANGEMENT FOR CONVERTING SIGNAL VOLTAGES

BACKGROUND OF THE INVENTION

1. Field of the Invention

The invention relates to logic-signal level-converter type logic circuit to the input of an unsaturated logic circuit.

2. Description of the Prior Art

In data processing systems and similar equipment, there is currently an increasing use of unsaturated logic circuits of the kind known as ECL-circuits, such as are described in "The Electronic Engineer," Nov. 1967, pages 56–60.

The fundamental element is in the form of a differential amplifier with two emitter-coupled transistors which are alternately driven into the blocked and conductive conditions. A load-independent current supply (impressed current) ensures that the transistor that is conductive at any instant cannot be driven into the saturation range. The signal voltages in the unsaturated logic system are preferably set at −0.8 Volts for the higher level and about −1.6 Volts for the lower level.

It is frequently necessary to arrange for unsaturated logic circuits to be driven by saturated logic circuits, that is to say circuits whose transistors are operated in the saturation range when in the conductive condition, such as TTL and DTL logic circuits. The signal voltages, of such saturated logic circuits, when using npn-transistors, generally lie between +2.4 and +5 Volts for the higher voltage level and between 0 and +0.4 Volts for the lower level.

The primary object of the present invention is therefore to provide a circuit arrangement for the conversion of signal voltages coming from saturated logic circuits, into signal voltages suitable for unsaturated logic circuits.

Another object of this invention is to provide the just-mentioned type of circuit in integrable form, in particular wherein with a high level of input voltage signal, the control voltage (also at a high level) for the unsaturated logic circuit should be kept constant as far as possible independently of fluctuation in the input voltage.

SUMMARY OF THE INVENTION

The invention resides in the provision of a logic-signal level-converter circuit arrangement for connecting the output of a saturated type logic circuit to the input of an unsaturated logic circuit, in which at least one input signal terminal is connected via a respective rectifying junction to a common point that is connected via a resistor to a first supply voltage terminal said common point being connected via a further rectifying junction to the base of an emitter-follower transistor whose collector is connected to said first supply voltage terminal via a resistor, the emitter of said emitter-follower transistor being connected to the base and collector of a multi-emitter transistor which has one emitter connected to a point of fixed potential and a second emitter connected to a second supply voltage terminal of polarity opposite to that of said first supply terminal via a voltage divider consisting of two resistors connected in series with their junction connected to an output terminal.

More specifically, the circuit arrangement is characterized in that the input signal is supplied to the emitter of a first transistor whose base is connected across a resistor to a first supply voltage source with a polarity which is dependent upon the conductivity type of the transistors used, and whose collector is connected to the base of a second transistor operating in an emitter-follower arrangement; in that a multi-emitter transistor with two emitters, is provided, whose base and collector are connected to the emitter of the second transistor and one of whose emitters is connected to a fixed potential, preferably zero potential; and in that between the second emitter of the multi-emitter transistor and the second supply voltage source with a polarity opposite to that of the first, a voltage divider consisting of two resistors, is arranged, whose voltage at the junction between the resistors is used as the control voltage for the ensuring unsaturated logic circuit.

BRIEF DESCRIPTION OF THE DRAWINGS

Other objects, features and advantages of the invention will be best understood from the following detailed description taken in conjunction with the accompanying drawings, in which.

DESCRIPTION OF THE PREFERRED EMBODIMENTS

Figure 1:
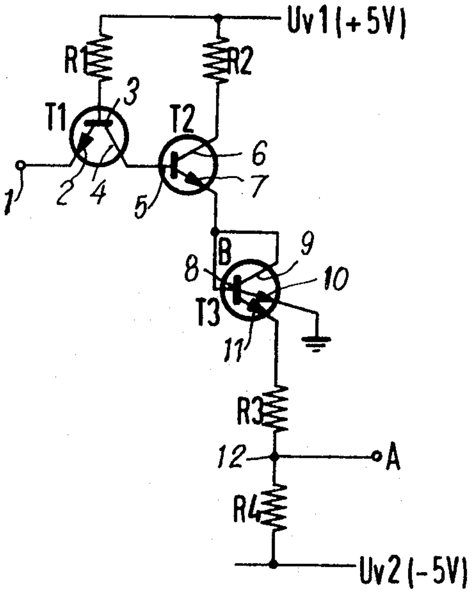
FIG. 1 is a circuit diagram of one exemplary embodiment of the invention.

In the embodiment shown in FIG. 1, an input terminal 1 is connected to the emitter 2 of a first npn-transistor T1 and provided for receiving signals from a saturated logic circuit of the TTL or DTL type. The base electrode 3 of the transistor T1 forms a common point which is connected to a positive supply terminal Uv1, of for example +5 volts, via a resistor R1. The collector 4 of the transistor T1 is connected to the base 5 of a second transistor T2, which is connected in an emitter-follower configuration, its collector 6 being connected to the positive terminal Uv1 via a resistor R2, and its emitter 7 being connected to the base electrode 8 and collector electrode 9 of a multi-emitter transistor T3. An emitter 10 of the transistor T3 is connected to a point of reference potential, such as earth. An emitter 11 of the transistor T3 is connected to a negative supply source Uv2, of for example −5 volts, via a voltage divider comprising two resistors, R3 and R4, connected in series. The junction 12 of the latter two resistors R3 and R4 is connected to an output terminal A, to provide a signal voltage suitable for driving an unsaturated logic circuit, such as an ECL circuit. If the first transistor T1 is a multi-emitter transistor, the circuit arrangement can be used simultaneously for the logic combination of several separate input signals. Unused inputs can remain unwired, or be connected to a point of fixed potential whose magnitude corresponds to the higher of the input signal voltage levels.

When the higher input voltage level is applied to the emitter 2 of the transistor T1, or at all the emitters in the case of a multi-emitter transistor, the transistor T1 operates in an inverted fashion, i.e. the emitter and collector electrodes exchange roles, the collector junction being biased in the forward direction. Consequently, a current flows from the input terminal 1 via the emitter-collector path which corresponds to the collector current of a normally operated transistor, although it flows in the reverse direction. The current flowing through the collector 4 of the transistor T1 drives the transistor T2 conductive.

Figure 2:
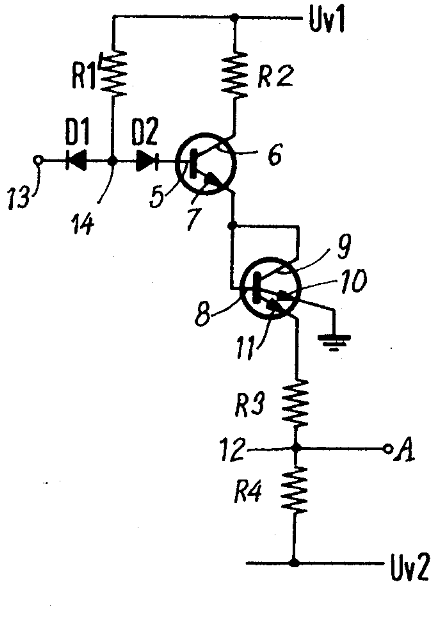
FIG. 2 is a circuit diagram of another embodiment similar to that shown in FIG. 1.

The mode of operation of this input circuit can be more readily appreciated by study of the modified circuit arrangement shown in FIG. 2, where the emitter junction of the transistor T1 of FIG. 1, are replaced by two independent diodes D1 and D2 which are both connected to the supply terminal Uv1 via a resistor R1′. The higher input voltage level at the input terminal 13 will block the diode D1, or at least raise the potential of the common point formed by the junction 14 between the two diodes and the resistor R1′ to a potential corresponding to the sum of the input voltage plus the forward voltage of a semiconductor diode, (normally −0.7 volts in the case of a silicon diode). This will enable current to flow through the forward-operated diode D2 to the base of the transistor T2 and drive the latter conductive.

In either embodiment shown, the emitter current of the transistor T2 flows partially through the emitter junction to the emitter 10 of the transistor T2, which is at zero potential, and partially through the second emitter junction to the emitter 11 and thence via the voltage divider to the negative supply voltage source Uv2. The current divides in such a way that the potential on the second emitter 11 of the transistor T3 is equivalent to the zero potential, provided that the first emitter 10 is conducting. This latter condition can always be ensured by selection of the resistance value of the resistor R2. The higher input voltage level at the output terminal A, for an ensuing unsaturated logic circuit, is then determined by the division ratio R3/(R3 +R3) and the operating voltage $Uv2$, which is generally the same as the operating voltage for the unsaturated logic circuits. The higher input voltage level is not dependent upon the supply voltage $Uv1$, or upon fluctuations in the input signal or the temperature dependancy of the voltage drops across the emitter junctions of the transistor T3. Consequently, this level can be maintained with adequate accuracy.

In addition, when using integrated circuit techniques, the resistance ratio can be precisely established. The temperature drift in the absolute values of the resistances has no effect if the two resistors are at similar temperatures at all times, as will be the case if the arrangement is constructed as an integrated circuit. When the lower input voltage level is applied to the emitter of the transistor T1, or to at least one of the emitters in the case where said transistor is a multi-emitter type, this transistor normally conducts. The transistor T2 remains conductive, but its emitter potential reduces to such an extend that the emitter 10 of the associated transistor T3 blocks, and the potential of the second emitter 11 is then three semiconductor junction voltages (about 2.1 volts) below the input voltage. Thus, the output voltage provided at terminal A for the ensuing circuit is displaced so far in the negative direction that the ensuing circuit is reliably blocked.

It should also be pointed out that the converter circuit as shown in FIG. 2 not only represents a substitute circuit through which one can more readily appreciate the mode of operation of the system shown in FIG. 1, but can also actually be produced in the illustrated form. As far as its function is concerned, it is operationally the same as the circuit arrangement of FIG. 1.

Many changes and modifications of the invention may be made by one skilled in the art without departing from the spirit and scope of the invention, and it is to be understood that we intend to include within the patent warranted hereon all such changes and modifications as may reasonably and properly be included within the scope of our contribution to the art.

What we claim is:

1. A logic signal level converter circuit for conducting the output of a saturated type logic circuit to the input of an unsaturated type logic circuit comprising a first rectifying junction, an input terminal connected to said first rectifying junction, a first voltage supply terminal, a first resistor connecting said first rectifying junction to said first voltage supply terminal, a second rectifying junction connected to said first voltage supply terminal via said first resistor, an emitter follower transistor circuit including a base electrode connected to said first voltage supply terminal via said second rectifying junction and said first resistor, a collector electrode, a second resistor connecting said collector electrode to said first voltage supply terminal, an emitter electrode, and a multi-emitter transistor including base and collector electrodes connected to said emitter electrode of said emitter follower transistor circuit, a first emitter of said multi-emitter transistor connected to a fixed potential to fix the output signals of said converter circuit to a predetermined level, a second voltage supply terminal poled opposite said first voltage supply terminal, a second emitter of said multi-emitter transistor, and a voltage divider connected between said second emitter and said second voltage supply terminal and including a junction point serving as an output terminal.

2. The converter circuit according to claim 1, wherein each of said rectifying junctions is a diode.

3. The converter circuit according to claim 1, comprising a single transistor which forms both said first and second rectifying junctions.

4. The converter circuit according to claim 3, wherein said first and second rectifying junctions are respectively the emitter and collector junctions of said single transistor.

5. The converter circuit according to claim 1, wherein said converter circuit is an integrated circuit.

* * * * *

UNITED STATES PATENT OFFICE
CERTIFICATE OF CORRECTION

Patent No. 3,660,676 Dated May 2, 1972

Inventor(s) Werner Fleischhammer and Friedrich-Karl Kroos

It is certified that error appears in the above-identified patent and that said Letters Patent are hereby corrected as shown below:

Column 3, line 1, read "R3/(R3+R3)" as --R3/(R3+R4)--.

Signed and sealed this 6th day of March 1973.

(SEAL)
Attest:

EDWARD M.FLETCHER,JR.
Attesting Officer

ROBERT GOTTSCHALK
Commissioner of Patents